United States Patent [19]
Wiklof et al.

[11] Patent Number: 6,114,962
[45] Date of Patent: Sep. 5, 2000

[54] RF TAG HAVING STRAIN RELIEVED STIFF SUBSTRATE AND HYDROSTATIC PROTECTION FOR A CHIP MOUNTED THERETO

[75] Inventors: Christopher A. Wiklof, Everett; Steven C. Hugh, Bothell, both of Wash.

[73] Assignee: Intermec IP Corp., Beverly Hills, Calif.

[21] Appl. No.: 09/173,137

[22] Filed: Oct. 15, 1998

[51] Int. Cl.⁷ ................................................. G08B 13/187
[52] U.S. Cl. .................................. 340/572.8; 340/572.1; 340/572.5; 340/572.7
[58] Field of Search ........................... 340/572.1, 572.5, 340/572.7, 572.8

[56] References Cited

U.S. PATENT DOCUMENTS

| | | | |
|---|---|---|---|
| 5,528,222 | 6/1996 | Moskowitz et al. | 340/572.1 |
| 5,538,803 | 7/1996 | Gambino et al. | 428/694 TM |
| 5,552,778 | 9/1996 | Schrott et al. | 340/825.34 X |
| 5,554,974 | 9/1996 | Brady et al. | 340/572.7 |
| 5,566,441 | 10/1996 | Marsh et al. | 29/600 |
| 5,600,175 | 2/1997 | Orthmann | 257/532 |
| 5,682,143 | 10/1997 | Brady et al. | 340/572.6 |
| 5,708,419 | 1/1998 | Isaacson et al. | 340/572.1 |
| 5,786,626 | 7/1998 | Brady et al. | 257/673 |
| 5,898,370 | 4/1999 | Reymond | 340/572.1 |
| 5,995,006 | 11/1999 | Walsh | 340/572.1 |
| 6,031,459 | 2/2000 | Lake | 340/572.8 |

FOREIGN PATENT DOCUMENTS

| | | | |
|---|---|---|---|
| 0 231 937 A2 | 8/1987 | European Pat. Off. | H01L 23/52 |
| 0 231 937 B1 | 8/1987 | European Pat. Off. | G06K 19/077 |
| 0 595 549 A2 | 5/1994 | European Pat. Off. | H04Q 9/00 |

*Primary Examiner*—Glen Swann
*Attorney, Agent, or Firm*—Perkins Coie LLP

[57] ABSTRACT

An RF tag for inclusion in a smart label comprises a stiff substrate sized to be received in the smart label, an antenna carried by the substrate and an integrated circuit having a memory circuit carried by the substrate and coupled to the antenna by wire bonding. The substrate may be strain relieved, for example, by forming a pair of generally opposed serpentine edges on the substrate, or forming a plurality of grooves in at least one surface of the substrate. A smart label comprises the RF tag between a face sheet and an adhesive. A release liner may cover the adhesive. A compressably deformable material having a low viscoelastic modulus is received between the first surface of the substrate and the face sheet partially surrounding the circuit structure and wire bonds to hydrostatically protect against damage. A film layer with a blister may envelop the low viscoelastic modulus material.

36 Claims, 6 Drawing Sheets

RF TAG HAVING STRAIN RELIEVED STIFF SUBSTRATE AND HYDROSTATIC PROTECTION FOR A CHIP MOUNTED THERETO

TECHNICAL FIELD

This invention relates to the fabrication of radio frequency ("RF") memory devices, and more particularly to the wire bonding of electrical and electronic devices, such as integrated circuits, to contacts or bonding pads on a substrate to form an RF memory tag or "smart" label.

BACKGROUND OF THE INVENTION

Memory devices for storing and retrieving data are known in the art. For example, radio frequency ("RF") tags are available from a number of manufacturers, including Texas Instruments of Dallas, Tex. The manufacturing of wireless memory devices typically includes laminating a flexible circuit substrate carrying appropriate electrical and electronic devices, such as an RF tag, between a face sheet and a release liner to form a "smart label."

The flexible circuit substrate generally carries electrical connections such as traces and contacts on the surface of the substrate. In the case of an RF memory device, the flexible substrate also carries an antenna. The antenna typically takes the form of an electrical trace on the surface of the substrate. The flexible circuit substrate also carries an electronic structure, such as an integrated circuit. Coupling of the integrated circuit to the electrical traces or contacts typically employs flip-chip surface mounting techniques. Flip-chip mounting is a technique in which a leadless chip or die electrically and mechanically interconnects to the contacts by means of conductive bumps, such as solder, on the chip's face.

The integrated circuit typically includes a memory portion and a logic portion. The logic portion controls the reading, writing, or manipulating of data in the memory portion. The logic portion further couples the memory portion to the antenna to form a transmitter, receiver, or transceiver for reading or writing data to, or from, the RF tag. Thus, for example, an RF tag may receive and transmit RF signals to write data to the memory and to read data from the memory. In the case of a "passive" device, the chip may also include analog circuitry for deriving power from an RF field. Alternatively, a battery or other discrete power source may provide power to an "active" device.

The face sheet may provide a protective surface over a first surface of the circuit substrate, for example to protect the antenna and the electronic structure. The face sheet also provides a surface for carrying identifying indicia. A pressure sensitive adhesive may cover a second surface of the circuit substrate to readily affix the memory device to an item or container. The release liner provides a selectively removable protective layer over the pressure sensitive adhesive, that a user removes before applying the memory tag to an item or container.

The existing laminate structures and methods of manufacturing memory tags present certain problems. Current structures have been unable to take advantage of low cost chip-on-board surface mounting techniques such as wire bonding to couple the integrated circuit to the antenna, bonding pads, or contacts. This is in part due to the use of a flexible circuit substrate. Wire bonding techniques typically employ ultrasonic acoustic energy to bond the bonding wires to the bonding pads on the substrate. The flexible substrate tends to oscillate with the ultrasonic acoustic energy causing the bonding to fail. While stiff substrates, such as printed circuit boards formed of FR-4 are used for mounting integrated circuits, such stiff substrates are generally considered incompatible with the memory tag applications. For example, the face sheet tends to separate from the stiff substrate when a smart label is fed through a printer or when a continuous web of smart labels are rolled into a coil.

A further obstacle to the use of wire bonding in smart labels is the force asserted on the wire bonds during manufacturing and printing operations. For example, excessive stress and strain may be exerted on the bonding wires and the bonds by rollers in a device such as a printer or laminator. Such pressure will tend to break the bonding wires or cause the bonding wires to separate from the bonding pads. Such pressure may also cause damage to the integrated circuit.

A further drawback of existing structures is potential damage caused to a print head as it rides over discontinuities in memory devices. This is particularly a problem for thermal printers. Additionally, the discontinuity tends to lower print quality.

SUMMARY OF THE INVENTION

Under one aspect of the invention, an RF tag comprises stiff substrate sized and dimensioned to be received in a smart label, an antenna carried by the substrate and an integrated circuit having a memory circuit carried by the substrate and coupled to the antenna by wire bonding. The stiff substrate may be strain relieved to enhance flexibility along at least one direction. The strain relief may be performed after the wire bonding, or may be in areas spaced away from bonding pads or contacts where the bonding wires are bonded, so that the substrate is sufficiently stiff to permit wire bonding by ultrasonic acoustic energy.

Some suitable structures and methods for strain relieving include forming a pair of generally opposed serpentine edges on the substrate, or forming a plurality of grooves or channels in at least one surface of the substrate. The strain relieving increases the flexibility of the resulting RF tag or smart label permitting the structure to pass through a roll-to-roll conversion process, or to be wound onto a smaller radius roll, or to be passed through a printer. The strain relieving also attempts to match the stiffness of the substrate to the stiffness of the face sheet. If the difference in stiffness is too great, the face sheet will tend to separate from the substrate, especially when the laminate structure is rolled into a coil or bent around a roller. If the difference in stiffness is not excessively large the face sheet will remain adhered to the substrate even under bending forces.

Under another aspect of the invention, a smart label comprises a stiff substrate, an antenna carried by the substrate, an integrated circuit carried by the substrate and coupled to the antenna, a face sheet disposed over a first surface of the substrate and an adhesive disposed over a second surface of the substrate. The integrated circuit may be wire bonded to the antenna. The stiff substrate may be strain relieved after wire bonding or in areas spaced away from the bonding pads or contacts.

In another aspect of the invention, a method of forming an electronic device comprises providing a stiff substrate, forming an antenna circuit on the stiff substrate, coupling a circuit structure to the antenna, positioning a face sheet over at least a portion of a first surface of the substrate, disposing an adhesive over at least a portion of a second surface of the substrate and positioning a release liner over the adhesive. The substrate may be strained relieved as described above.

In a further aspect of the invention, an electronic device comprises a substrate having a first surface, a circuit structure carried on the first surface of the substrate, a face sheet positioned over at least a portion of the first surface of the substrate and the circuit structure, and a fluid material received between the first surface of the substrate and the face sheet and at least partially surrounding the circuit structure. The fluid material may have a low viscoelastic modulus, the viscoelastic displacement of the fluid reducing peak pressure on the circuit structure and bonding wires. The viscoelastic displacement may thereby protect the circuit structure and bonding wires, and may also protect components such as a print head that contact the electronic device. The viscoelastic displacement may also increase the print quality of printing on the electronic device.

In yet another aspect of the invention, a method of forming a memory tag comprises supplying a substrate having a first surface, locating an electrical structure on the first surface, positioning a cover layer over the electrical structure and depositing a low viscoelastic modulus material between the first surface and the cover layer to hydrostatically cushion the electrical structure. The RF tag may further include an envelope positioned between the first surface of the substrate and the face sheet to at least partially enclose the low viscoelastic modulus material.

In this way a relatively stiff substrate may be employed in a memory tag, allowing the use of low cost mounting techniques. Further, a non-curing, non-setting low viscoelastic modulus material hydrostatically cushions the bonding wires, the bonds and the circuit structure at least during manufacturing operations.

DETAILED DESCRIPTION OF THE INVENTION

In the following description, certain specific details are set forth in order to provide a thorough understanding of various embodiments of the invention. However, one skilled in the art will understand that the invention may be practiced without these details. In other instances, well known structures associated with integrated circuits, antennas, radio frequency transmitters and receivers, and machine-readable symbologies have not been shown or described in detail to avoid unnecessarily obscuring the description of the embodiments of the invention.

Figure 1:
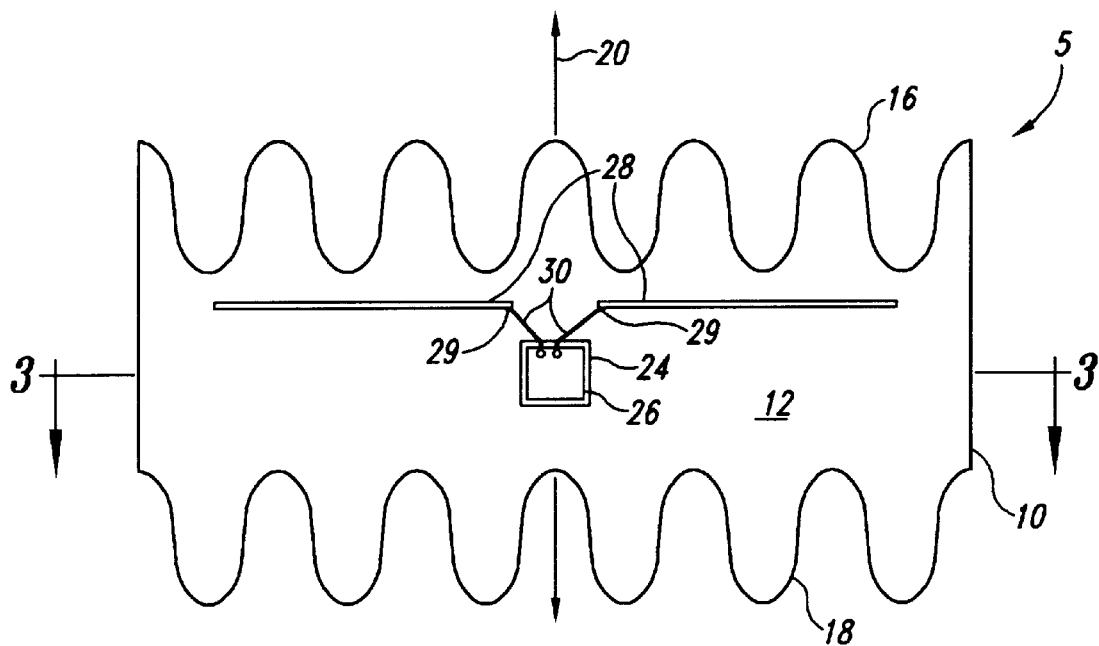
FIG. 1 is a top plan view of an RF tag having a substrate, an integrated circuit and an antenna.
Figure 2:
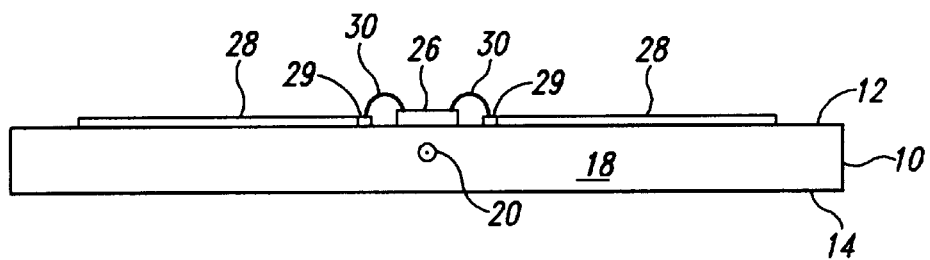
FIG. 2 is a side elevational view of the RF tag of FIG. 1.
Figure 3:
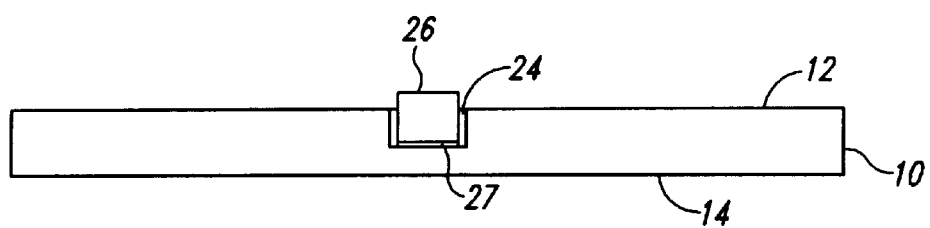
FIG. 3 is a cross-sectional view along section line 3—3 of FIG. 1.
Figure 14:
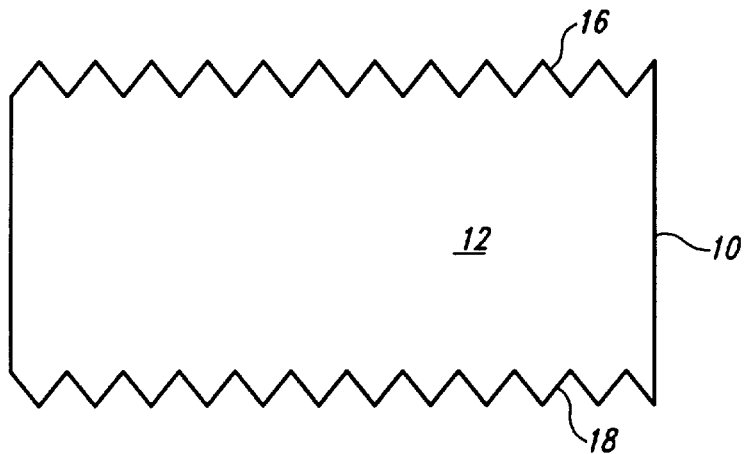
FIG. 14 is a top plan view of a stiff substrate having a regular, matched, serrated opposed edges.
Figure 15:
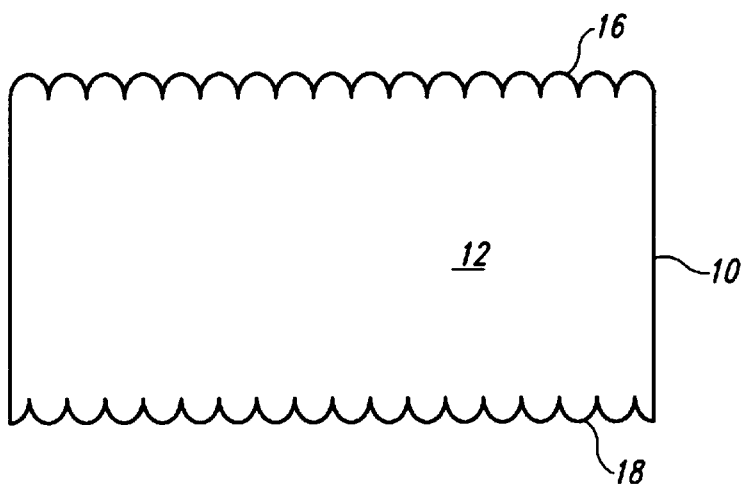
FIG. 15 is a top plan view of a stiff substrate having regular, unmatched scalloped opposed edges.
Figure 16:
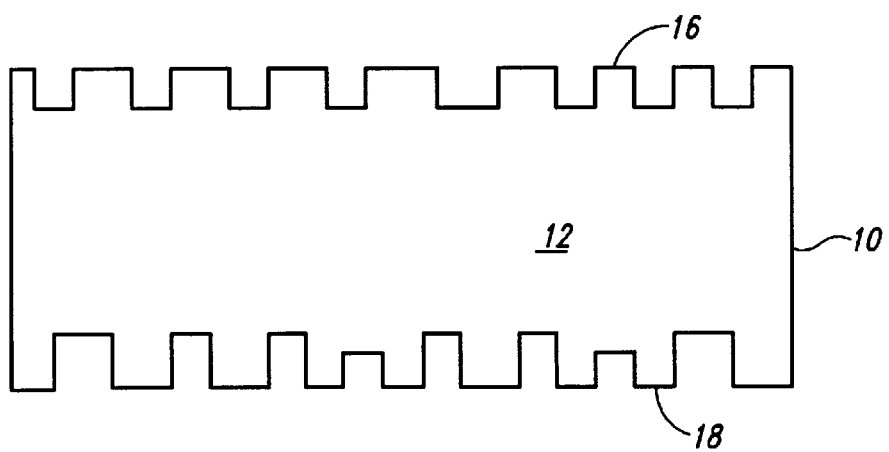
FIG. 16 is a top plan view of a stiff substrate having irregular, umatched opposed edges.

FIGS. 1, 2, and 3 show an RF tag 5 including a substrate 10 of a relatively stiff material for carrying a circuit structure. The substrate 10 should be sufficiently stiff to allow wire bonding using ultrasonic acoustic energy. For example a single layer of FR-4 fiber glass, approximately 8.5 millimeters thick is suitable. Examples of other suitable materials polyimide, polyether ketone, and polyesterteraphalte (PET). The substrate 10 has a first surface 12 and a second surface 14. The substrate 10 further includes a pair of generally opposed serpentine edges 16, 18 for strain relieving the substrate 10 with respect to bending motion about an axis 20, such that the substrate 10 bends in the transverse direction. The term serpentine as used herein includes any convoluted, scalloped (FIG. 15), serrated (FIG. 14), curvilinear, corrugated, notched (FIG. 16) or sinusoidal edge (FIG. 1), whether regular or irregular. The opposed edges 16, 18 may be matched, for example peaks transversely opposite one another, or may be staggered with respect to one another. The convolutions forming the serpentine edges 16, 18 may be unmatched with respect to one another.

Figure 10:
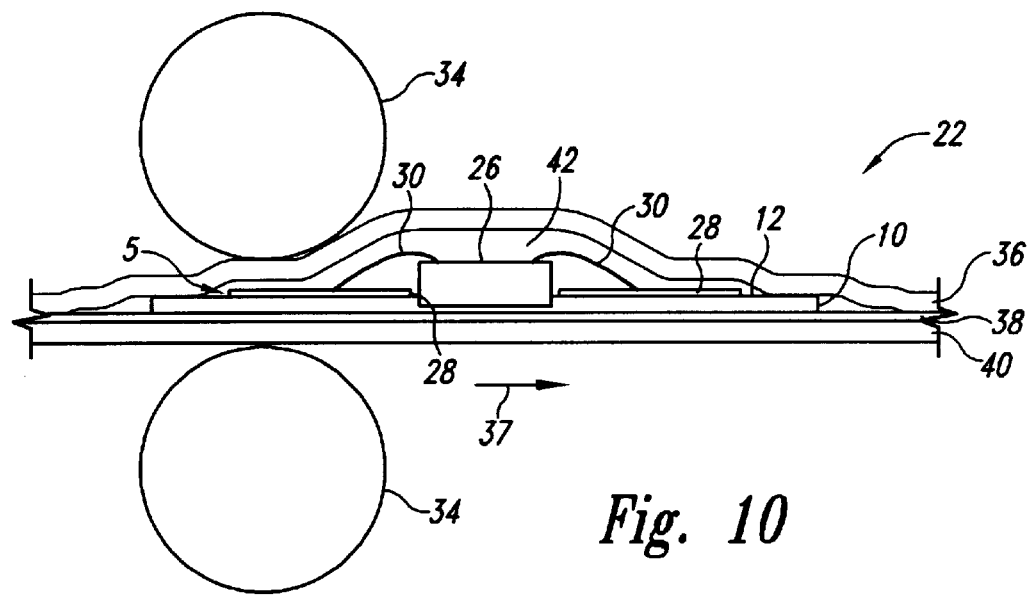
FIG. 10 is a cross-sectional view of a smart label including a compressibly deformable low viscoelastic modulus material, the smart label passing between a pair of rollers.

The number of convolutions, the spacing of the convolutions, and the radii of curvature of the convolutions forming the serpentine edges 16, 18 may be selected to adjust the stiffness of the substrate to more closely match the stiffness of a face sheet 36 (FIG. 10).

The size and dimensions of the substrate 10 may be suitable for receiving the substrate 10 in a smart label 22 (FIG. 10), for example, where the smart label 22 is a pre-formed pocket for receiving the RF tag 5. The smart label 22 may, for example, be a pocket formed by the face sheet 32, an adhesive layer 38 and a release liner 40 (FIG. 10). With continuing reference to FIGS. 1, 2 and 3, a recess 24 in the first surface 12 of the substrate 10 provides a location for mounting a microelectronic structure, such as an integrated circuit 26. An adhesive 27 may secure the integrated circuit 26 in the recess 24.

The integrated circuit 26 includes a memory portion in the form of memory circuits and a logic portion in the form of logic circuits for storing, retrieving, and manipulating data in the memory portion (both not shown). The integrated circuit 26 may further include power circuitry for generating power from an RF field, as is conventionally known in the art. Alternatively, the integrated circuit 26 may receive power from a discrete power source, such as a battery or photoelectric cells (not shown).

The first and second surfaces 12, 14 may carry electrical components such as conductive traces and bonding pads as required. For example, an electrical trace on the first surface 12 of the substrate 10 forms an antenna 28 having bonding pads 29 at the ends thereof. The antenna 28 may consist of any electrically conductive material, for example aluminum or copper. Suitable methods for forming conductive elements in electronics for radio frequency tags are disclosed in the commonly assigned U.S. patent application Ser. No. 09/082,427, filed May 20, 1998, entitled "METHOD AND APPARATUS FOR MAKING ELECTRICAL TRACES, CIRCUITS AND DEVICES" (Attorney Docket No. 480062.585). A pair of bonding wires 30 electrically couple the antenna 28 to the integrated circuit 26. The antenna 28 permits the logic circuit to receive and transmit data externally from the RF tag 5 (FIG. 10) via RF signals. A pair of bonding pads 29 are formed at the ends of the antenna 28. One skilled in the art will note that the bonding pads 29 are generally spaced away from the serpentine edges 16, 18 to ensure that the substrate 10 is sufficiently stiff around the bonding pads 29 to permit wire bonding using ultrasonic acoustics.

Figure 4:
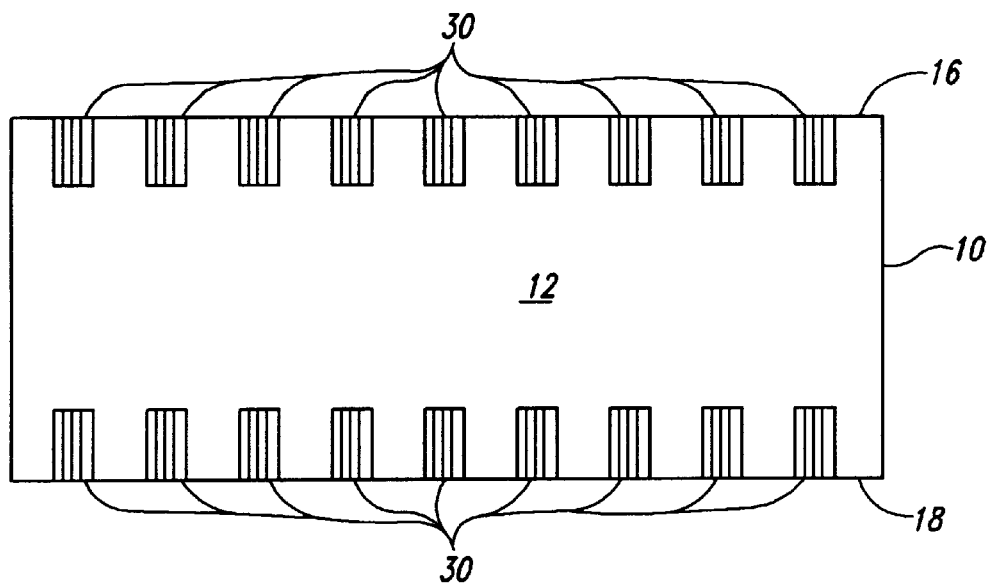
FIG. 4 is a top plan view of a stiff substrate having an alternative strain relief structure.
Figure 5:
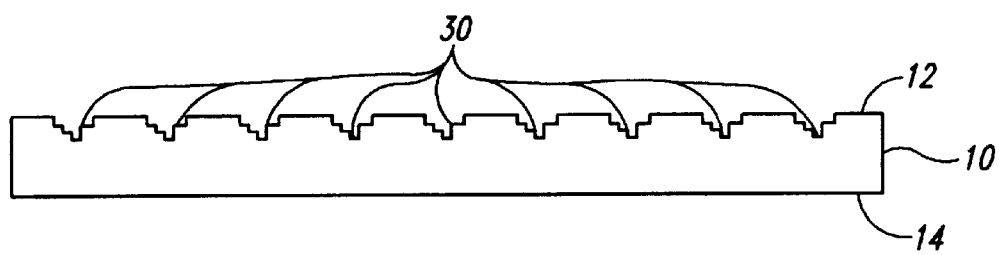
FIG. 5 is a side elevational view of the stiff substrate of FIG. 4.

FIGS. 4 and 5 show a first alternative exemplary embodiment of the substrate 10. This alternative embodiment, and those described herein, are substantially similar to the previously described embodiment, and common elements are identified by the same reference numbers. Only the significant differences are described in detail.

The substrate 10 includes a plurality of stepped grooves 30 in the first surface 12 and spaced along the generally opposed edges 16 and 18. The reader will note that the generally opposed edges 16, 18 are no longer serpentine, but are generally straight parallel edges, the stepped grooves 30 providing the strain relief for the substrate 10. The reader will also note that the stepped grooves 30 do not extend across the entire first surface 12, leaving the center portion of the substrate 10 sufficiently stiff after forming the strain relief for wire bonding by ultrasonic acoustics. One skilled in the art will understand that the stepped grooves 30 could extend across the entire substrate 10 if the wire bonding is performed before the grooves 30 are formed for strain relief.

Figure 6:
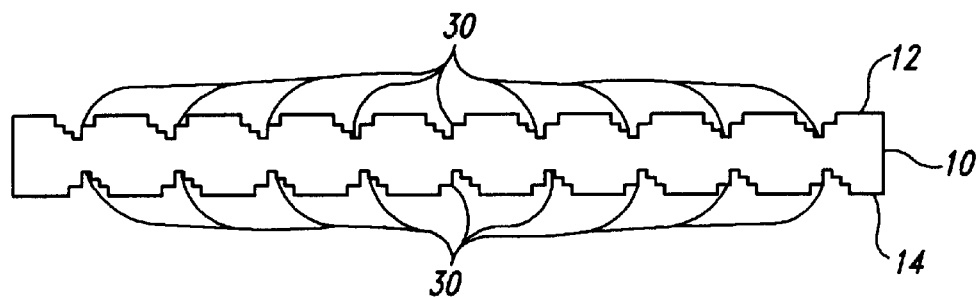
FIG. 6 is a side elevational view of an alternative embodiment of the stiff substrate of FIG. 4.

FIG. 6 shows an alternative embodiment of the substrate 10 including stepped grooves 30 formed in the first surface 12 and the second surface 14. The embodiment of Figure provides added strain relief over the embodiment of FIG. 5, although the embodiment of FIG. 6 may be more costly to manufacture.

Figure 7:
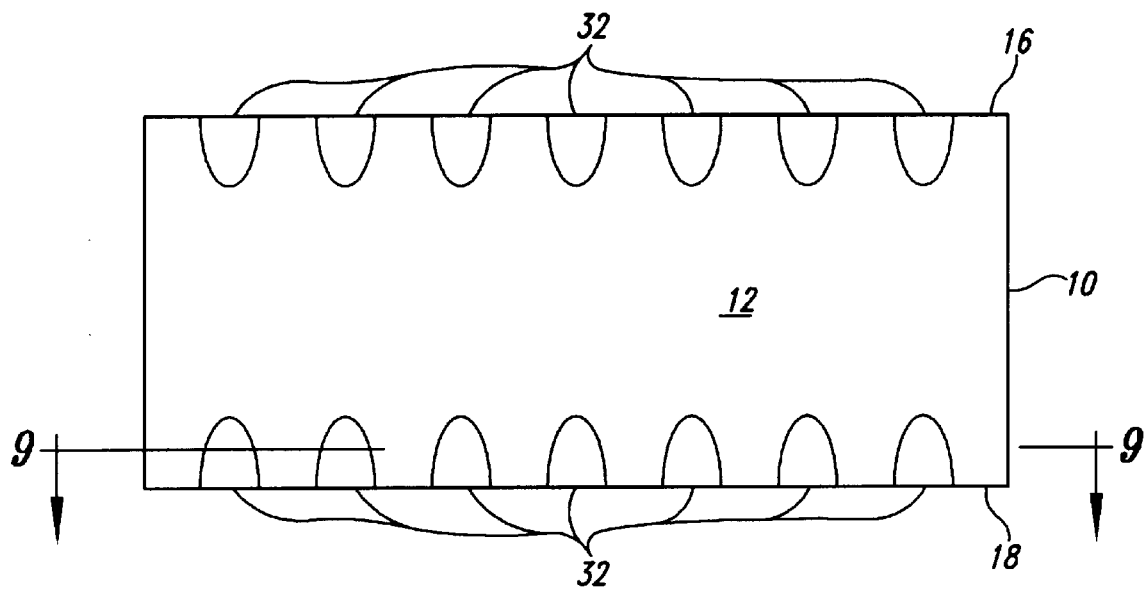
FIG. 7 is a top plan view of a stiff substrate having a second alternative strain relief structure.
Figure 8:
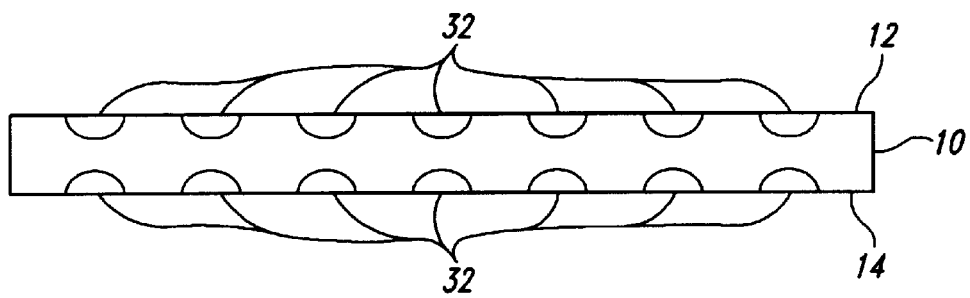
FIG. 8 is a side elevational view of the stiff substrate of FIG. 7.
Figure 9:
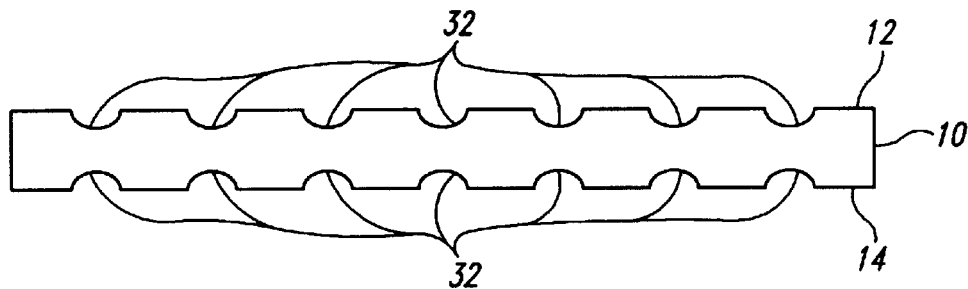
FIG. 9 is a cross-sectional view of the stiff substrate taken along section line 9—9 of FIG. 7.

FIGS. 7 and 8 show another alternative exemplary embodiment of the substrate 10. The substrate 10 includes a plurality of tapered grooves 32 formed in the first and second surfaces 12, 14 and extending along the opposed edges 16, 18. The tapered grooves 32 taper in width from the respective edges 16, 18 inwards toward the center of the substrate 10. The tapered grooves 32 also taper in depth from the edges 16 and 18 of the substrate 10 inward, as can best be seen in FIG. 9. While a number of specific embodiments of strain relief structures are disclosed herein, one skilled in the art will recognize that any structure that decreases the first derivative of stiffness over distance for the substrate 10 will provide strain relief to the substrate 10, thereby increasing the flexibility or compliance of the substrate 10 in at least one direction. In other words, since the material forming the substrate 10 contributes to the stiffness, a reduction in the amount of material will reduce the stiffness and increase the flexibility. By removing material from selected portions of the substrate 10 one may control the flexibility in given portions of the substrate 10 and in given directions.

The strain relief structures of FIGS. 1–9 reduce the difference between the modulus of elasticity of the substrate 10 and the modulus of elasticity of a face sheet 36, thus preventing separation of the face sheet 36 from the substrate 10 when the smart label 22 is placed under stress. One skilled in the art will appreciate that the modulus of elasticity of a material is a value corresponding to stress per unit strain.

FIG. 10 shows a smart label 22 moving between a pair of rollers 34 in a direction indicated by arrow 37. The smart label 22 includes a cover or face sheet 36, an adhesive layer 38, and a selectively removable release liner 40 covering the adhesive layer 38. The RF tag 5 is positioned in the smart label 22 between the face sheet 36 and the adhesive layer 38. The face sheet 36 may form a seal about the edge thereof with the adhesive layer 38 to form an envelope for enclosing a low viscoelastic modulus material 42, for example silicone or latex. The viscoelastic modulus $M_{VE}$, is given by the following formula, where $\tau$ is shear stress, $\gamma_e$ is the elastic deformation and $\gamma_f$ is viscos flow.

$$M_{VE} = \tau/(\gamma_e + \gamma_f)$$

The low viscoelastic material 42 should be significantly more compliant than typical cured glob top materials, the viscoelastic displacement reducing peak pressures on the various components. Suitable low viscoelastic modulus materials may have a viscoelastic modulus of between approximately 500 psi and 200,000 psi depending upon the application. For the manufacturing of memory devices and printing thereon with a thermal printhead, the viscoelastic modulus is preferably between 1,750 psi and 90,000 psi, 15,000 psi being particularly adequate for such applications. Suitable materials may include solvent and water based adhesives, latex adhesives, natural rubber and block copolymers such as styrene elastomers, styrene copolymers, and silicone.

One skilled in the art will recognize that the viscoelastic modulus is temperature sensitive and that the desired low viscoelastic modulus is stated in terms of the service temperature range. In other words, the low viscoelastic modulus characteristics must be displayed at temperatures consistent with the manufacturing, storage and operation or use of the memory devices. The service temperature range should be within the range between the glass temperature $T_g$ and the melting temperature $T_m$ of the material 42. The reader will also note that low viscoelastic modulus characteristics are particularly useful during the manufacturing of the memory device, including passage through any rollers, such as during printing operations. One skilled in the art will recognize that the low viscoelastic modulus material may be curable, substantially raising the viscoelastic modulus after manufacturing operations are complete.

One skilled in the art will note that higher viscoelastic modulus materials may prove useful where, for example, the platen rollers 34 applying pressure to the smart label 22 are also relatively compliant. Thus the total compliance between the platen rollers 34 and the low viscoelastic modulus material 42 must be sufficiently high to protect the bonding wires 30.

When pressure is asserted on the smart label 22, for example by rollers 34, the low viscoelastic modulus material 42 deforms, exerting an isostatic hydraulic ("hydrostatic") pressure on the bonding wires 30 and the integrated circuit 26. The low viscoelastic modulus material 42 thus distributes the pressure about the structure, thereby protecting the bonding wires 30, the bonds and integrated circuit 26 from damage.

Figure 11:
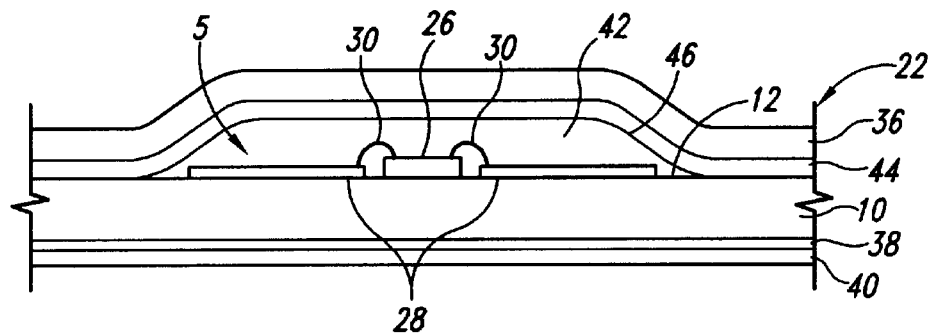
FIG. 11 is a cross-sectional view of an alternative embodiment of a smart label including a film layer enclosing a low viscoelastic modulus material.

FIG. 11 shows an alternative embodiment of the smart label 22, including a film layer 44 between the face sheet 22 and the substrate 10. The film layer 44 forms a seal to the first surface 14 of the substrate 10, for example by the way of adhesive (not shown) to form an envelope and includes a pocket or blister 46 to receive the low viscoelastic modulus material 42. The film layer 44 may provide advantages over simply using the face sheet 22 for enclosing the low viscoelastic modulus material 42, such as providing a stronger and/or more flexible enclosure for the low viscoelastic modulus material 42. The film layer 44 may also permit the face sheet 22 to be added at a later step, for example by a manufacturer of smart labels that procures RF tags from a separate vendor of RF tags. The blister 46 of FIG. 11 is sized to accommodate the integrated circuit 26, bonding wires 30, antenna 28 and a sufficient amount of the low viscoelastic modulus material 42 to cover the electronic structure.

Figure 12:
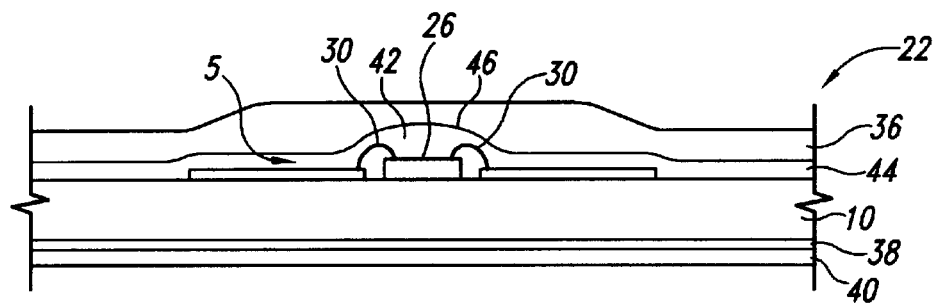
FIG. 12 is a cross-sectional view of another alternative embodiment of a smart label including a film layer having a blister enclosing a low viscoelastic modulus material.

FIG. 12 shows another alternative embodiment of the smart label 22, wherein the blister 46 is sized to accommodate only the integrated circuit 26, bonding wires 30 and a smaller amount of the low viscoelastic modulus material 42 then the embodiment of FIG. 11. This embodiment provides protection to only the most sensitive components, the integrated circuit 26 and the bonding wires 30.

Figure 13:
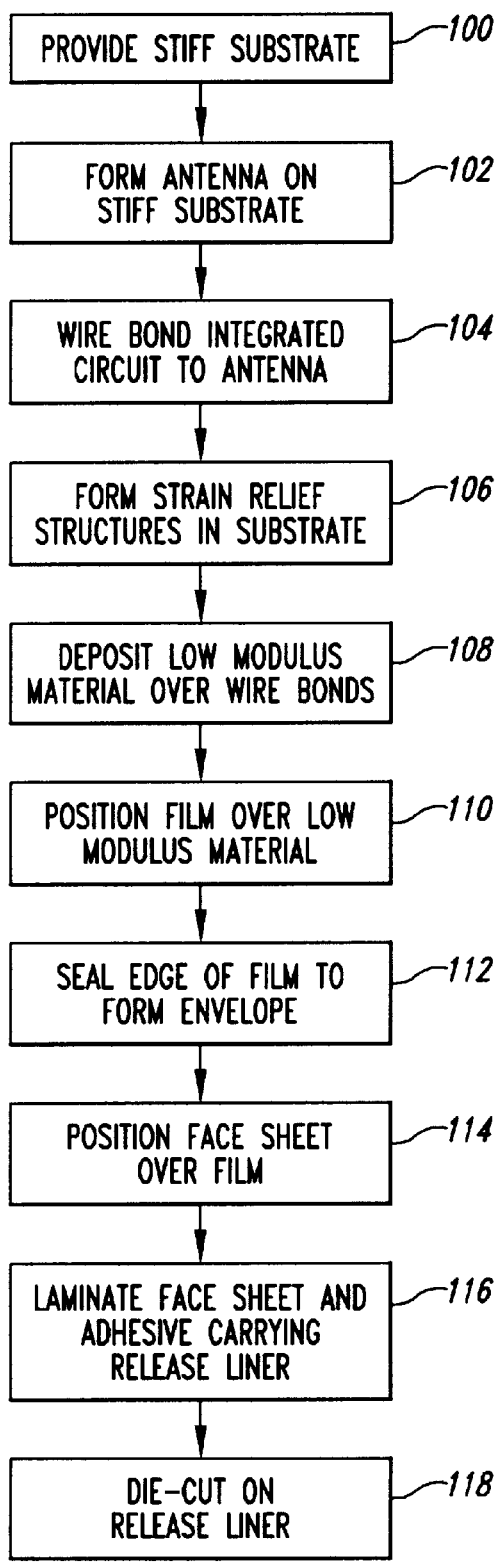
FIG. 13 is an exemplary method of forming a smart label.

FIG. 13 shows an exemplary method of forming a smart label 22. Step 100 provides a stiff substrate 10, preferably in the form FR-4 fiberglass. In step 102, an antenna 28 is formed on the first surface 12 of the substrate 10. Forming the antenna 28 may include depositing a layer of suitably conductive material, such as aluminum, on the first surface 12 of the substrate 10. Forming the antenna 28 may also include etching the conductive layer so as to form conductive traces that serve as the antenna 28 and as mounting pads and electrical connections (not shown) as is commonly known in the art. Alternative methods of forming the antenna 28 may include, for example, printing conductive circuits or traces on the first surface 12 of the substrate 10. Suitable methods for forming conductive elements and electronics for radio frequency tags are disclosed in the commonly assigned U.S. patent application Ser. No. 09/082,427, filed May 20, 1998, entitled "METHOD AND APPARATUS FOR MAKING ELECTRICAL TRACES, CIRCUITS AND DEVICES".

In step 104, pick and place machinery may mount the integrated circuit 26 in the recess 24 of the first surface 12 of the substrate 10. The integrated circuit 26 is coupled to the antenna 28 using conventional chip-on-board wire bonding techniques, such as bonding using ultrasonic acoustic energy.

In step 106, cutting, routing, stamping or grinding tools form strain relief structures, such as serpentine edges 16, 18, stepped grooves 30, or tapered grooves 32, in at least the first surface 12 of the substrate 10. While the substrate 10 may be strain relieved prior to step 104, one skilled in the art will understand that forming the strain relief structures 16, 18, 30, 32 after the wire bonding permits substantially the entire substrate 10 to be strain relieved since stiffness is no longer required, the bonding having been accomplished.

In step 108, the low viscoelastic modulus material 42 is deposited over the bonding wires 30 and the integrated circuit 26. Step 110 includes positioning the film 44 over the low viscoelastic modulus material. Heat may be applied to the film 44 to form a blister 46 prior to positioning of the film 44. In step 112, the edge of the thin film is sealed to form an envelope for retaining the low viscoelastic modulus material 42.

In step 114, a face sheet 36 is positioned over the film 44. In step 116, the face sheet 36 is laminated with a release liner 40 carrying a pressure sensitive adhesive. The release liner 40 is selectively removable to expose the adhesive 38 for allowing the smart label 22 to be easily secured to an item or container. In step 118, the resulting structure is die cut on the release liner 40 to form a number of smart labels 22. The smart labels 22 may fed through a printer (not shown) to pre-print predefined information on the face sheet 36. An end user may feed the smart labels 22 through another printer (not shown) to print application specific information on the face sheet 36, such as a barcode symbol or other machine readable symbol.

Other RF tag and manufacturing techniques are discussed in detail in U.S. Ser. No. 09/164,203, filed Sep. 30, 1998, entitled "MEMORY TAG AND METHOD OF MANUFACTURE"; and U.S. Ser. No. 09/173,539, filed Oct. 15, 1998, entitled "WIRELESS MEMORY DEVICES AND METHOD OF MANUFACTURE" (Attorney Docket No. 480062.630); U.S. Ser. No. 09/164,200, filed Sep. 30, 1998, entitled CHIP PLACEMENT ON SMART LABEL". All U.S. patent applications noted above are incorporated herein by reference. The teachings of *Elements of Materials Science & Engineering,* 4th Edition, by Van Vlack, Addison-Wesley Publishing Co. (1980) are also incorporated herein by reference.

Although specific embodiments of the invention and examples for the present invention are described herein for illustrative purposes, various equivalent modifications can be made without departing from the spirit and scope of the invention, as will be recognized by those skilled in the relevant art. The teachings provided herein of the present invention can apply to other forms of memory devices not necessarily the exemplary RF tag and smart label generally described above. The memory devices may employ adhesives other than pressure sensitive adhesives, and some embodiments may completely omit adhesives. Similarly, some embodiments of the memory device may omit release liners. Further, the memory devices may communicate at frequencies other than radio frequency range of the electromagnetic spectrum, and other methods of coupling the integrated circuit and the antenna may be employed. In some embodiments the antenna may be omitted or formed as part of the integrated circuit. In such embodiments wire bonding may couple the integrated circuit to a power source such as a battery or photoelectric cell. Additionally, one skilled in the art will recognize that other known strain relief methods may be suitable to the present application.

These and other changes can be made to the invention in light of the above-detailed description. In general, in the following claims, the terms used should not be construed to limit the invention to the specific embodiments disclosed in the specification and the claims, but should be construed to include all memory devices and methods of manufacturing memory devices that operate in accordance with the claims. Accordingly, the invention is not limited the disclosure, but instead its scope is to be determined entirely by the following claims.

We claim:

1. An RF tag for inclusion in a smart label, comprising:
   a stiff substrate sized and dimensioned to be received in the smart label wherein selected portions of the substrate are formed to provide strain relief for the substrate in at least one direction;
   an antenna carried by the substrate; and
   an integrated circuit having a memory circuit carried by the substrate and coupled to the antenna by at least one bonding wire.

2. The RF tag of claim 1 wherein the substrate is formed to provide a pair of generally opposed serpentine edges to relieve strain.

3. The RF tag of claim 1 wherein the substrate is formed to provide a plurality of grooves in a surface of the substrate to relieve strain.

4. The RF tag of claim 1 wherein the substrate is formed to provide a reduced integrated cross section as an edge of the substrate is approached.

5. The memory tag of claim 1 wherein the substrate comprises FR-4.

6. A smart label, comprising:
a stiff strain relieved substrate;
an antenna carried by the substrate;
an integrated circuit having a memory circuit carried by the substrate and coupled to the antenna;
a face sheet disposed over a first surface of the substrate; and
and adhesive disposed over a second surface of the substrate.

7. The smart label of claim 6 wherein the integrated circuit is coupled to the antenna by at least one bonding wire.

8. A substrate for forming an RF tag, comprising:
a stiff substrate sized and dimensioned to be received in a smart label; and
a number of strain relief structures formed into the substrate.

9. The substrate of claim 8 wherein the strain relief structures comprise a pair of generally opposed serpentine edges of the substrate.

10. The substrate of claim 8 wherein the strain relief structures comprise a number of grooves defined in at least one surface of the substrate.

11. The substrate of claim 8 wherein the strain relief structures comprise a number of stepped grooves defined in at least one surface of the substrate.

12. A method of forming an RF tag for inclusion in a smart label, comprising:
dimensioning a stiff substrate to be received in the smart label;
strain relieving the substrate;
forming an antenna on a first surface of the stiff substrate;
locating a circuit structure including a memory circuit on the stiff substrate; and
wire bonding the circuit structure to the antenna.

13. The method of claim 12 where strain relieving the substrate comprises forming a pair of generally opposed serpentine edges on the substrate.

14. The method of claim 12 wherein strain relieving the substrate comprises forming a pair of generally opposed serpentine edges on the stiff substrate after wire bonding the circuit structure.

15. The method of claim 12 wherein strain relieving the stiff substrate comprises:
selecting a stiffness of the substrate based on the stiffness of a face sheet;
determining a radius of curvature for each of a plurality of convolutions to achieve the selected stiffness; and
forming the plurality of convolutions having the determined radii of curvature on the edge of the substrate.

16. The method of claim 11 wherein strain relieving the substrate comprises forming a number of grooves in at least a first surface of the substrate.

17. A method of forming an electronic device, comprising:
providing a stiff substrate;
forming strain relief features in the stiff substrate;
forming an antenna on the stiff substrate;
coupling a circuit structure to the antenna;
positioning a face sheet over at least a portion of a first surface of the substrate;
disposing an adhesive over at least a portion of a second surface of the substrate; and
positioning a release liner over the adhesive.

18. An electronic device, comprising:
a substrate having a first surface;
a circuit structure carried on the first surface of the substrate;
a face sheet positioned over at least a portion of the first surface of the substrate and the circuit structure; and
a compressibly deformable material received between the first surface of the substrate and the face sheet and at least partially surrounding the circuit structure.

19. The electronic device of claim 18 wherein the compressibly deformable material has a viscoelastic modulus of approximately 15,000 psi.

20. The electronic device of claim 18 wherein the compressibly deformable material has a viscoelastic modulus of less than approximately 200,000 psi.

21. The electronic device of claim 18 wherein the compressible deformable material has a viscoelastic modulus of less than approximately 90,000 psi.

22. The electronic device of claim 18, further comprising:
at least one mounting pad on the first surface of the substrate; and
at least one wire bond coupling the circuit structure to the at least one mounting pad.

23. The electronic device of claim 18 further comprising:
an envelope received between the substrate and the face sheet, the envelope at least partially enclosing the compressibly deformable material.

24. An smart label, comprising;
a substrate having a first surface;
a circuit structure carried on the first surface of the substrate;
a face sheet positioned over at least a portion of the first surface of the substrate and the circuit structure; and
an intermediate material positioned between the first surface of the substrate and the face sheet and at least partially enveloping the circuit structure, the intermediate material having a viscoelastic modulus of less than approximately 200,000 psi.

25. The smart label of claim 24 wherein the intermediate material has a viscoelastic modulus of less than approximately 90,000 psi.

26. The smart label of claim 30 wherein the intermediate material has a viscoelastic modulus of approximately 15,000 psi.

27. The smart label of claim 24, further comprising:
a film positioned between the substrate and the face sheet, the film defining a pocket at least partially enclosing the intermediate material.

28. The smart label of claim 24 wherein the substrate is strain relieved.

29. The smart label of claim 24 wherein the substrate has a pair of generally opposed serpentine edges.

30. The smart label of claim 24 wherein the circuit structure comprises an integrated circuit including a memory circuit, the integrated circuit being wire bonded to at least one bonding pad formed on the substrate.

31. The smart label of claim 24 wherein the circuit structure comprises an integrated circuit and further comprising:
an antenna carried by the substrate and coupled to the integrated circuit by at least one bonding wire.

32. The smart label of claim 24, further comprising:

an adhesive layer carried on a second surface of the substrate, the second surface opposed to the first surface; and a release liner covering the adhesive layer and selectively removable therefrom to expose the adhesive layer.

33. A method of forming a memory tag, comprising:

supplying a substrate having a first surface;

locating an electrical structure on the first surface of the substrate;

positioning a cover layer over the electrical structure and the first surface of the substrate; and depositing an intermediate material having a low viscoelastic modulus between the first surface of the substrate and the cover layer, the intermediate material overlying the electrical structure to hydrostatically cushion the electrical structure.

34. The method of claim 33 wherein supplying a substrate comprises supplying a stiff strain relieved substrate.

35. The method of claim 33 wherein the intermediate material is deposited before positioning the cover layer.

36. The method of claim 33 wherein the intermediate material is deposited after positioning the cover layer.

* * * * *

UNITED STATES PATENT AND TRADEMARK OFFICE
CERTIFICATE OF CORRECTION

PATENT NO. : 6,114,962
DATED : September 5, 2000
INVENTOR(S) : Christopher A. Wiklof and Steven C. Hugh It is certified that error appears in the above-indentified patent and that said Letters Patent is hereby corrected as shown below:

Column 9, line 56, "claim 11" should be --claim 12--; and

Column 10, line 47, "claim 30" should be --claim 24--.

Signed and Sealed this

Eighth Day of May, 2001

*Attest:*

NICHOLAS P. GODICI

*Attesting Officer*     *Acting Director of the United States Patent and Trademark Office*